United States Patent
Iguchi et al.

[11] Patent Number: 6,166,457
[45] Date of Patent: *Dec. 26, 2000

[54] PRINTED-CIRCUIT ASSEMBLY

[75] Inventors: Daisuke Iguchi; Osamu Ueno, both of Nakai-machi, Japan

[73] Assignee: Fuji Xerox Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/068,763

[22] PCT Filed: Oct. 6, 1997

[86] PCT No.: PCT/JP97/03566

§ 371 Date: Aug. 11, 1998

§ 102(e) Date: Aug. 11, 1998

[87] PCT Pub. No.: WO98/16092

PCT Pub. Date: Apr. 16, 1998

[30] Foreign Application Priority Data

Oct. 7, 1996 [JP] Japan ................................. 8-284688

[51] Int. Cl.[7] .................................................. H05K 1/16
[52] U.S. Cl. .............................. 307/91; 174/250; 333/247; 361/748; 361/763; 361/794
[58] Field of Search ........................ 307/91, 89; 333/247; 174/32, 35 R, 250, 260; 361/748, 780, 794, 763, 816

[56] References Cited

U.S. PATENT DOCUMENTS

| | | | |
|---|---|---|---|
| 4,904,988 | 2/1990 | Theus | 174/250 |
| 5,023,753 | 6/1991 | Abe | 361/748 |
| 5,719,750 | 2/1998 | Iwane | 361/794 |
| 5,926,377 | 7/1999 | Nakao et al. | 361/763 |
| 6,002,593 | 12/1999 | Tohya et al. | 361/765 |

FOREIGN PATENT DOCUMENTS

| | | |
|---|---|---|
| JP-A-63-107187 | 5/1988 | Japan . |
| JP-A-2-90587 | 3/1990 | Japan . |
| JP-A-2-237091 | 9/1991 | Japan . |
| JP-A-4-26187 | 1/1992 | Japan . |
| JP-A-4-202477 | 9/1995 | Japan . |
| JP-A-8-242047 | 9/1996 | Japan . |
| WO98/16092 | 4/1998 | WIPO . |

*Primary Examiner*—Albert W. Paladini
*Attorney, Agent, or Firm*—Oliff & Berridge

[57] ABSTRACT

A printed wiring board device used for electronic equipment, such as the information equipment, etc. A printed wiring board (10) has a power source layer (11) and a ground layer (12) and is mounted with active elements (3 and 4), such as digital ICs, etc. A first capacitor (1) which conductively couples the layers (11 and 12) with each other at a high frequency is provided in the peripheral section of one end side or the other end side of the section of the board (10) where the layers (11 and 12) are faced to each other. Second capacitors (2) which respectively supply transient currents to the active elements (3 and 4) are provided between the power supply pins (3V and 4V) of the elements (3 and 4) and the ground layer (12) near the elements (3 and 4). Therefore, the electromagnetic radiation caused by the power source layer (11) and the ground layer (12) of the printed wiring board (10) can be suppressed easily and remarkably.

13 Claims, 15 Drawing Sheets

$Lb \ll Ls, Cp \ll Cd$ und layers 32A and 32B.

PRINTED-CIRCUIT ASSEMBLY

TECHNICAL FIELD

The present invention relates to a printed wiring board device for use in constructing electronic equipment, such as information equipment, and to electronic equipment, such as information equipment employing the printed wiring board device.

BACKGROUND ART

Unwanted electromagnetic radiation has been a problem encountered by various information apparatuses in recent years. Since the primary electromagnetic radiation has a frequency spectrum corresponding to that of harmonics generated by a clock on a printed wiring board, it has been considered that electromagnetic radiation is caused mainly by a signal line for transmitting a clock signal or a digital signal synchronous with the clock signal. Therefore, various electromagnetic radiation preventing measures have been taken to suppress electromagnetic radiation from signal lines formed on printed wiring boards and wire harnesses connected to those signal lines.

More specifically, those electromagnetic radiation preventing measures include (1) subjecting signals including clock signals and digital signals to low-pass filtering process to pass only signals of frequencies in a necessary band, (2) combining a damping resistor to an output signal line to increase the rise time and the fall time of signals and (3) forming a guard pattern of a ground potential near a signal line to form a small feedback current loop.

However, as is generally known, a frequency distribution of electromagnetic waves actually detected on a printed wiring board is different from a frequency distribution of electromagnetic waves estimated from a distribution of currents on signal lines, and the frequency distribution curve has a sharp peak for a specific frequency independently of the properties of the signal line. Therefore, it is expected that a main cause of electromagnetic radiation from a printed wiring board is not the signal lines but the electrical power system of the printed wiring board; that is, the main cause of electromagnetic radiation is the electrical resonance between the power source layer and the ground layer of the printed wiring board.

It is apparent that the foregoing conventional radiation preventing measures taken to suppress electromagnetic radiation from the signal lines of a printed wiring board and wire harnesses connected to those signal lines are ineffective in preventing electromagnetic radiation caused by the power source layer and the ground layer of the printed wiring board.

A method of suppressing electromagnetic radiation caused by the electrical power system of a printed wiring board, proposed in "Low-EMI Multilayer Printed-circuit Board", Kairo Jisso Gakkai Taikai Ronbun-shi, Vol. 10, p.175 uses a printed wiring board of a structure shown in FIG. 19.

In a printed wiring board for carrying out the method of suppressing electromagnetic radiation previously proposed in "Low-EMI Multilayer Printed-circuit Board", two ground layers 32A and 32B are formed on the opposite sides of a power source layer 31, respectively, resistors 33 are connected to end portions of the ground layers 32A and 32B so as to connect the ground layers 32A and 32B. Dielectric layers 34A and 34B of different dielectric constants are formed between the power source layer 31 and the ground layer 32A and between the power source layer 31 and the ground layer 32B, respectively, to suppress electrical resonance between the power source layer 31 and the ground layers 32A and 32B.

The structure of the printed wiring board shown in FIG. 19, which is fabricated by forming the two ground layers 32A and 32B on the opposite sides of the power source layer 31, respectively, connecting the resistors 33 to end portions of the ground layers 32A and 32B so as to connect the ground layers 32A and 32B, forming the dielectric layers 34A and 34B of different dielectric constants between the power source layer 31 and the ground layer 32A and between the power source layer 31 and the ground layer 32B, respectively, is greatly different from that of general printed wiring boards. Furthermore, different matching conditions for suppressing electromagnetic radiation must be determined for different printed wiring boards of the foregoing structure differing from each other in size and shape. Therefore, it is very difficult to apply the structure shown in FIG. 19 to practical printed wiring boards and, even if the structure is applied to printed wiring boards, the printed wiring boards of such a structure will require a very high manufacturing cost.

Accordingly, it is an object of the present invention to provide a printed wiring board device for use in constructing an electronic equipment, such as information equipment capable of effectively suppressing electromagnetic radiation caused by the power source layer and the ground layer of a printed wiring board included therein and difficult to suppress by the conventional electromagnetic radiation suppressing measures taken to suppress electromagnetic radiation from signal lines formed on printed wiring boards and wire harnesses connected to those signal lines, of being applied to general purposes and of being fabricated at a low cost, having a structure similar to that of general printed wiring boards, and not requiring the setting of any special condition special for the size and the shape thereof.

DISCLOSURE OF INVENTION

According to a first aspect of the present invention, a printed wiring board device comprises a printed wiring board provided with a power source layer and a ground layer, active elements connected to the power source layer and the ground layer of the printed wiring board, first capacitors disposed for the high-frequency coupling of the power source layer and the ground layer in peripheral regions of a functional portion of the printed wiring board, i.e., a portion in which the power source layer and the ground layer correspond to each other, and second capacitors each disposed between a power supply pin of each active element or a portion of the power source layer around the power supply pin, and the ground layer and serving as a power supply for supplying a transient current to each active element.

The peripheral regions of the functional portion of the printed wiring board in which the first capacitors are disposed may be a border along one side of the functional portion of the printed wiring board at one end with respect to the direction of an electrical resonance current unique to the printed wiring board, borders along two opposite sides of the functional portions of the printed wiring board or borders along all the sides of the functional portion of the printed wiring board.

If the first capacitors are disposed in the borders along the opposite sides of the functional portion of the printed wiring board, it is desirable to disposed the first capacitors symmetrically with respect to a line perpendicular to the direction of the electrical resonance current.

According to a second aspect of the present invention, a printed wiring board device comprises a printed wiring board provided with a power source layer and a ground layer, active elements connected to the power source layer and the ground layer of the printed wiring board, first capacitors disposed for the high-frequency coupling of the power source layer and the ground layer along the nodes of an electrical resonance current unique to the printed wiring board in a functional portion of the printed wiring board, i.e., a portion in which the power source layer and the ground layer correspond to each other, and second capacitors each disposed between a power supply pin of each active element or a portion of the power source layer around the power supply pin, and the ground layer and serving as a power supply for supplying a transient current to each active element.

The nodes of the electrical resonance current along which the first capacitors are disposed may be the peripheral regions along one side of the functional portion of the printed wiring board at one end with respect to the direction of the electrical resonance current, borders along two opposite sides of the functional portion of the printed wiring board at the opposite ends or borders along all the sides of the functional portion of the printed wiring board.

Preferably, the first capacitors have a capacitance of is $1 \times 10^{-9}$ F or above, and the second capacitors have a capacitance of $1 \times 10^{-8}$ F or above.

Preferably, the first capacitors are arranged in a density of twenty capacitors per one meter or above.

A resistor may be connected in series to each of the first capacitor.

The inventors of the present invention conducted experiments to study the relation between the electrical resonance between the power source layer and the ground layer of a printed wiring board and electromagnetic radiation from the printed wiring board by using a four-layer printed wiring board. It was found from the results of experiments that a standing wave is generated on the power source layer and the ground layer terminating at an edge of the printed wiring board, and the standing wave causes electromagnetic radiation from the printed wiring board.

The standing wave generated on the power source layer and the ground layer is a composite wave composed of a fundamental wave of a frequency $f=c/(2W\epsilon^{1/2})$, where c is light velocity, $\epsilon$ is the dielectric constant of the material of the printed wiring board and W is the width of a portion of the printed wiring board in which the power source layer and the ground layer correspond to each other equal to ½ of wavelength $\lambda$, and the harmonics including a second harmonic, a third harmonic and so on.

The high-frequency current which generates the standing wave causing electromagnetic radiation on the power source layer and the ground layer is, principally, a through current which flows from a power system through the power supply pin of the active element into the active element when the active element such as a digital IC chip or the like mounted on the printed wiring board is in a transient state, such as a state for a switching operation or the like.

That is, a transient current flows from the power source layer of the printed wiring board to the power supply pin of the active element, a displacement current based on the transient current is reflected repeatedly at the edge of the printed wiring board to generate the standing wave on the power source layer and the ground layer and the standing wave causes electromagnetic radiation.

The inventors of the present invention planned to dispose capacitors for the high-frequency coupling of the power source layer and the ground layer in a border along one side of the functional portion of the printed wiring board at one end with respect to the direction of the electrical resonance current unique to the printed wiring board, in borders along the opposite sides of the functional portion of the printed wiring board at the opposite ends or on the nodes of the electrical resonance current unique to the printed wiring board.

The arrangement of the capacitors for the high-frequency coupling of the power source layer and the ground layer in the border along one side of the functional portion of the printed wiring board at one end with respect to the direction of the electrical resonance current or in the borders along the opposite sides of the functional portion of the printed wiring board at the opposite ends is expected to suppress the reflection of the displacement current at the edge of the printed wiring board so that electromagnetic radiation caused by the electrical resonance between the power source layer and the ground layer can be suppressed.

The arrangement of the capacitors for the high-frequency coupling of the power source layer and the ground layer along the nodes of the electrical resonance current is expected to reduce the high-frequency potential difference between the power source layer and the ground layer at the nodes of the electrical resonance current, so that the electrical resonance between the power source layer and the ground layer is suppressed and electromagnetic radiation caused by the electrical resonance is reduced.

However, it was found that the effect of such an arrangement of the capacitors for the high-frequency coupling of the power source layer and the ground layer on the reduction of electromagnetic radiation caused by the electrical resonance between the power source layer and the ground layer is insignificant, such an arrangement of the capacitors for the high-frequency coupling of the power source layer and the ground layer causes secondary electromagnetic radiation not caused by the electrical resonance between the power source layer and the ground layer, an electromagnetic radiation from the printed wiring board cannot be drastically reduced.

It is inferred that the effect of the reduction of electromagnetic radiation resulting from the electrical resonance between the power source layer and the ground layer is insignificant because charge stored in the capacitors for the high-frequency coupling of the power source layer and the ground layer serves as a current source of a low impedance to the power terminals of the active elements such as the digital IC chip or the like mounted on the printed wiring board, and supplies the charge to the active elements when the active elements operate. Consequently, a transient current flows through the active elements, the transient current is coupled with the resonance between the power source layer and the ground layer to generate a resonance current on the surface of the printed wiring board.

Furthermore, the transient current flowing through a loop including the power source layer and the ground layer causes secondary electromagnetic radiation not dependent on the electrical resonance between the power source layer and the ground layer.

The inventors of the present invention thought of employing, in addition to the first capacitors for the high-frequency coupling of the power source layer and the ground layer, second capacitors, which are expected to serve as sources of transient current for each active element, and arranging the second capacitors between the power supply pins of the active elements mounted on the printed wiring board and the ground layer.

A position where the second capacitor is disposed between the power supply pin of the active element and the ground layer is in a region near the active element in which the impedance of the second capacitor relative to the power supply system for the active element is far smaller than that of the first capacitor, and radiation by the ground loop including the power supply system for the active element, and the second capacitor is very low; that is, it is desirable to dispose the second capacitor between the power supply pin of the active element and a via hole for connecting the power supply pin to the power source layer, which, however, is not compulsory.

The current that flows from the power source layer to the active element is localized when the active element operates and the flow of the transient current from the first capacitor to the active element can be prevented by thus disposing the second capacitor which serves as a source for supplying a transient current to the active element near the active elements.

Consequently, the action of the transient current supplied from the first capacitor as a resonance current on the surface of the printed wiring board is prevented, the electrical resonance between the power source layer and the ground layer can be satisfactorily suppressed, and hence the primary electromagnetic radiation resulting from the electrical resonance between the power source layer and the ground layer can be satisfactorily reduced.

Since the transient current supplied from the first capacitor flows scarcely through the loop including the power source layer and the ground layer, the secondary electromagnetic radiation not dependent on the electrical resonance between the power source layer and the ground layer can be satisfactorily suppressed.

As is apparent from the foregoing description, the employment of both the first and the second capacitors suppresses satisfactorily both the primary electromagnetic radiation resulting from the electrical resonance between the power source layer and the ground layer and the secondary electromagnetic radiation not dependent on the electrical resonance between the power source layer and the ground layer, so that electromagnetic radiation caused by the power source layer and the ground layer of the printed wiring board can be very effectively suppressed to an insignificant degree. Accordingly, the employment of both the first and the second capacitors is an essential condition.

The printed wiring board may be of a general structure having a single power source layer and a single ground layer, and there is no necessity of setting different conditions for different printed wiring boards differing from each other in size and shape.

BEST MODE FOR CARRYING OUT THE INVENTION

Figure 1:
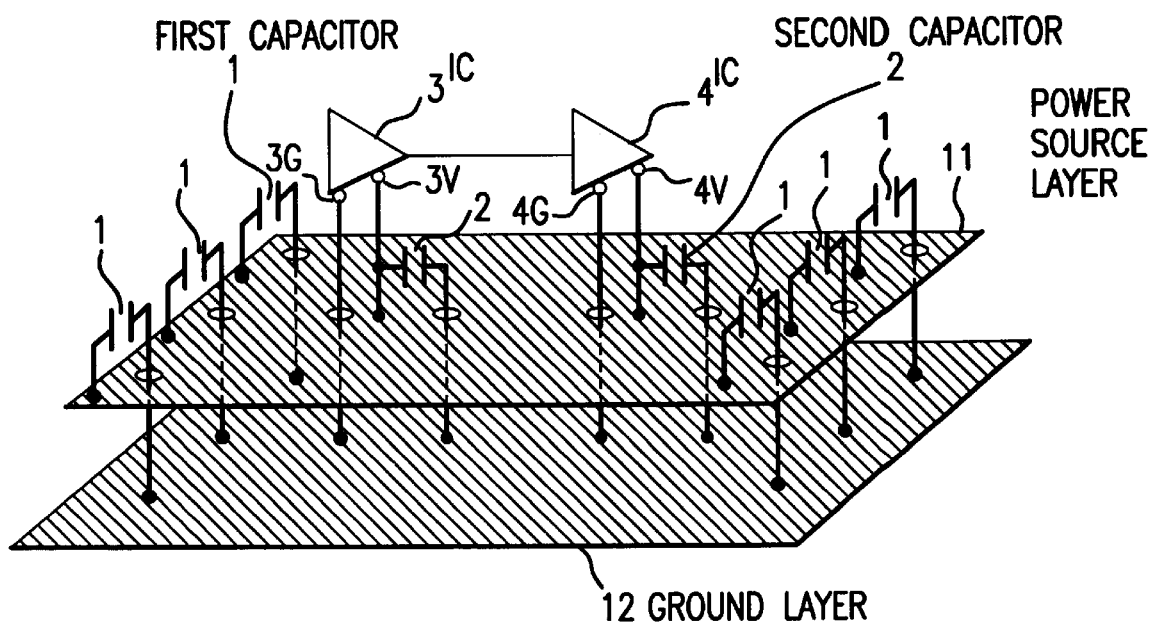
FIG. 1 is a schematic perspective view of a printed wiring board device in a first embodiment according to the present invention.
Figure 2:
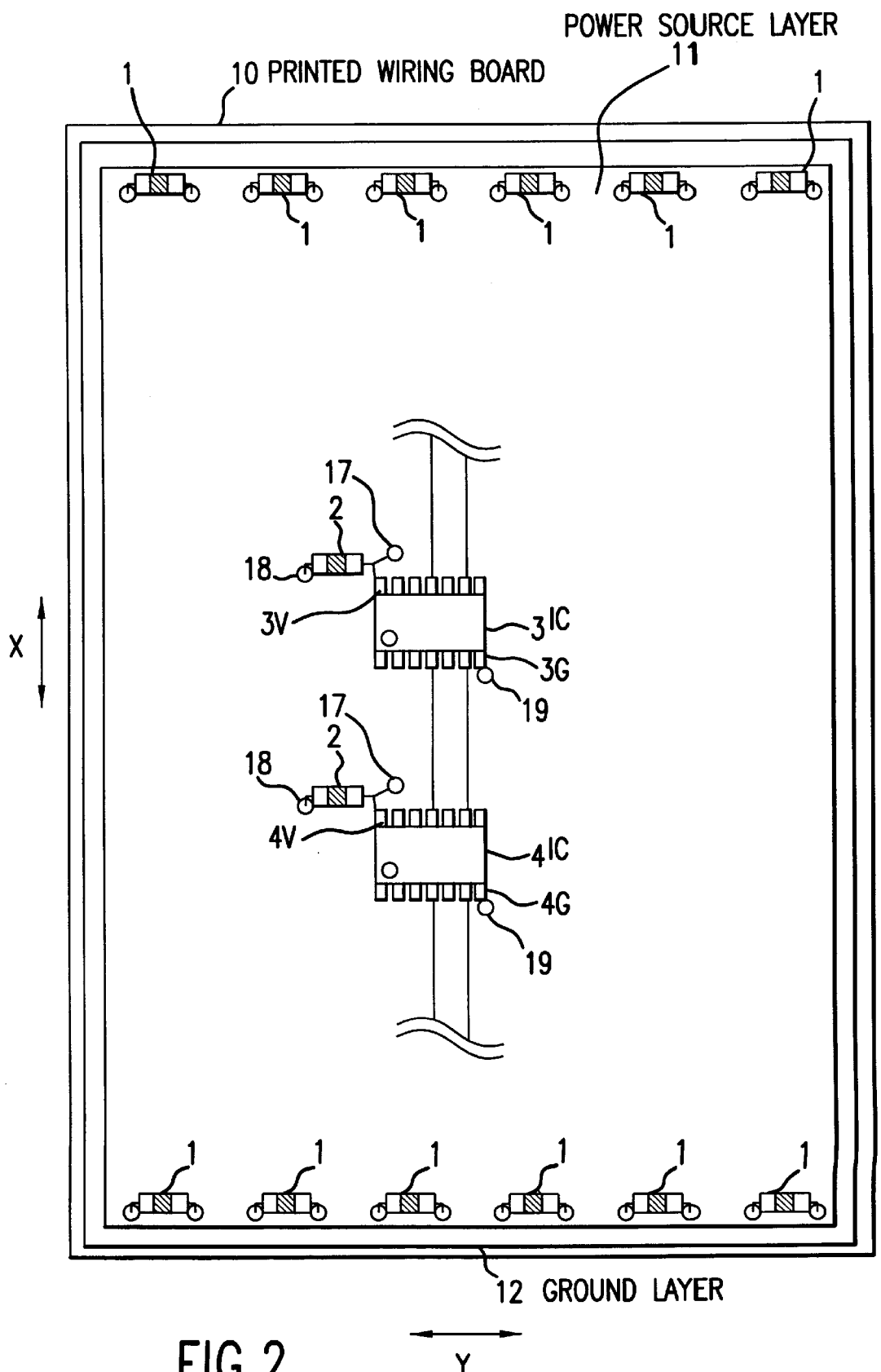
FIG. 2 is a schematic plan view of the printed wiring board device.
Figure 3:
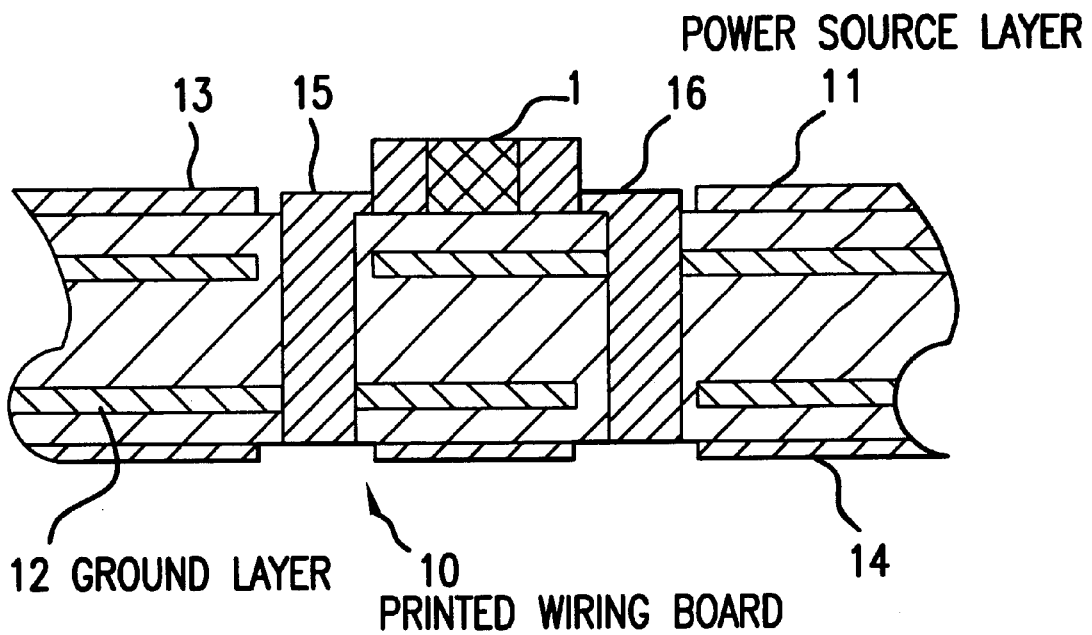
FIG. 3 is a fragmentary typical sectional view of the printed wiring board device.
Figure 4:
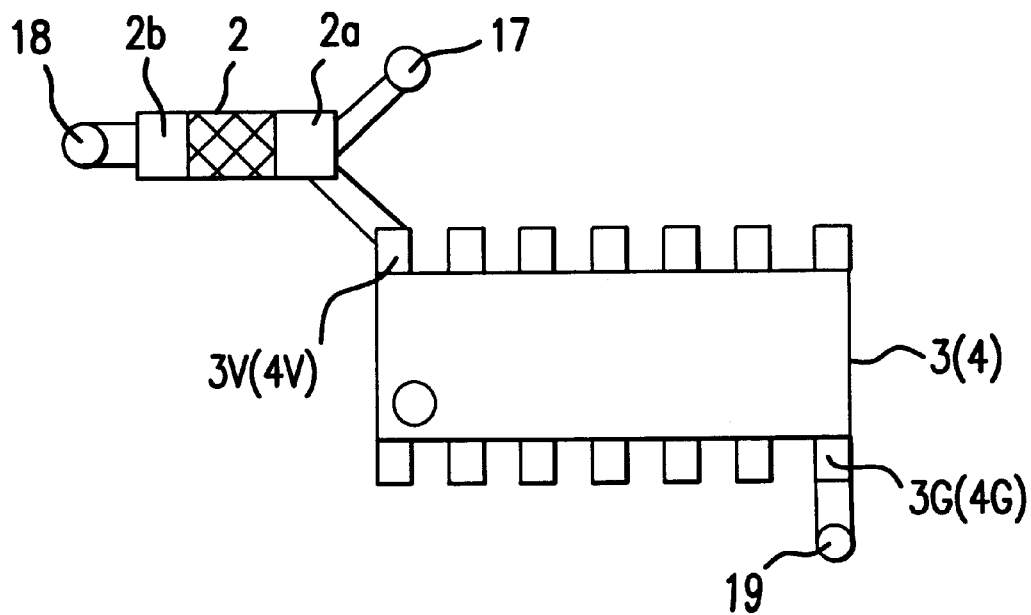
FIG. 4 is a plan view of a portion of the printed wiring board device.

A printed wiring board device in a first embodiment according to the present invention will be described with reference to FIGS. 1 to 4, in which FIG. 1 is a schematic perspective view of the printed wiring board device, FIG. 2 is a schematic plan view of the printed wiring board device, FIG. 3 is a typical sectional view of a portion of the printed wiring board device, including a first capacitor, and FIG. 4 is a schematic plan view of a portion of the printed wiring board device, in which a digital IC chip serving as an active element and a second capacitor are arranged.

Referring to FIG. 3, a printed wiring board 10 included in the printed wiring board device is a four-layer printed wiring board having a power source layer 11, a ground layer 12, a first pattern layer 13 and a second pattern layer 14. The printed wiring board 10 may be additionally provided with one or a plurality of pattern layers between the power source layer 11 and the ground layer 12.

As shown in FIG. 2, the printed wiring board 10 is rectangular and, in this embodiment, the power source layer 11 is slightly smaller than the ground layer 12. Therefore, a portion of the printed wiring board 10 in which the power source layer 11 and the ground layer 12 correspond to each other is a portion of the same coated with the power source layer 11.

A plurality of active elements including digital IC chips 3 and 4 are mounted on a surface of the printed wiring board 10 on which the first pattern layer 13 is formed. The digital IC chips 3 and 4 exchange digital signals. The digital IC chips 3 and 4 have power supply pins 3V and 4V, respectively. Each of the power supply pins 3V and 4V is connected to an electrode 2a of a second capacitor 2, and the electrode 2a is connected through a via hole 17 to the power source layer 11. The digital IC chips 3 and 4 have ground pins 3G and 4G, respectively. Each of the ground pins 3G and 4G is connected through a via hole 19 to the ground layer 12.

Figure 6:
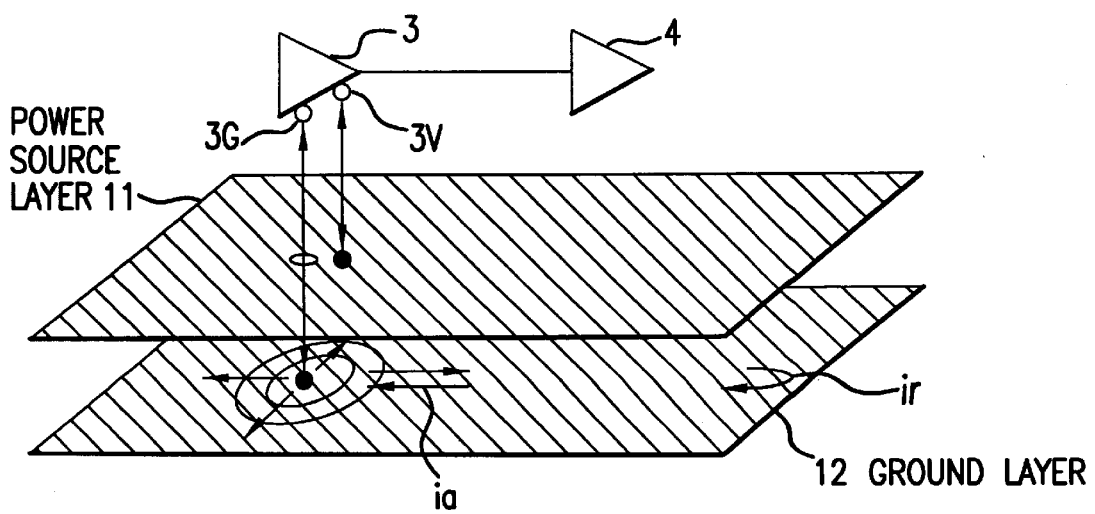
FIG. 6 is a diagrammatic view of assistance in explaining resonance between a power source layer and a ground layer.

If first capacitors 1 and the second capacitors 2 are not employed, a transient switching current flows from the power source layer 11 through the power supply pins 3V and 4V of the digital IC chips 3 and 4, whereby a displacement current $i_a$ of a harmonic of a working frequency is generated between the power source layer 11 and the ground layer 12 as shown in FIG. 6. The displacement current $i_a$ is reflected in an open end reflection mode at an end of the portion of the printed wiring board 10 in which the power source layer 11 and the ground layer 12 correspond to each other as represented by a current $i_r$, and a standing wave is generated according to resonance conditions unique to the printed wiring board 10. The standing wave makes the printed wiring board 10 emit electromagnetic radiation.

Figure 5:
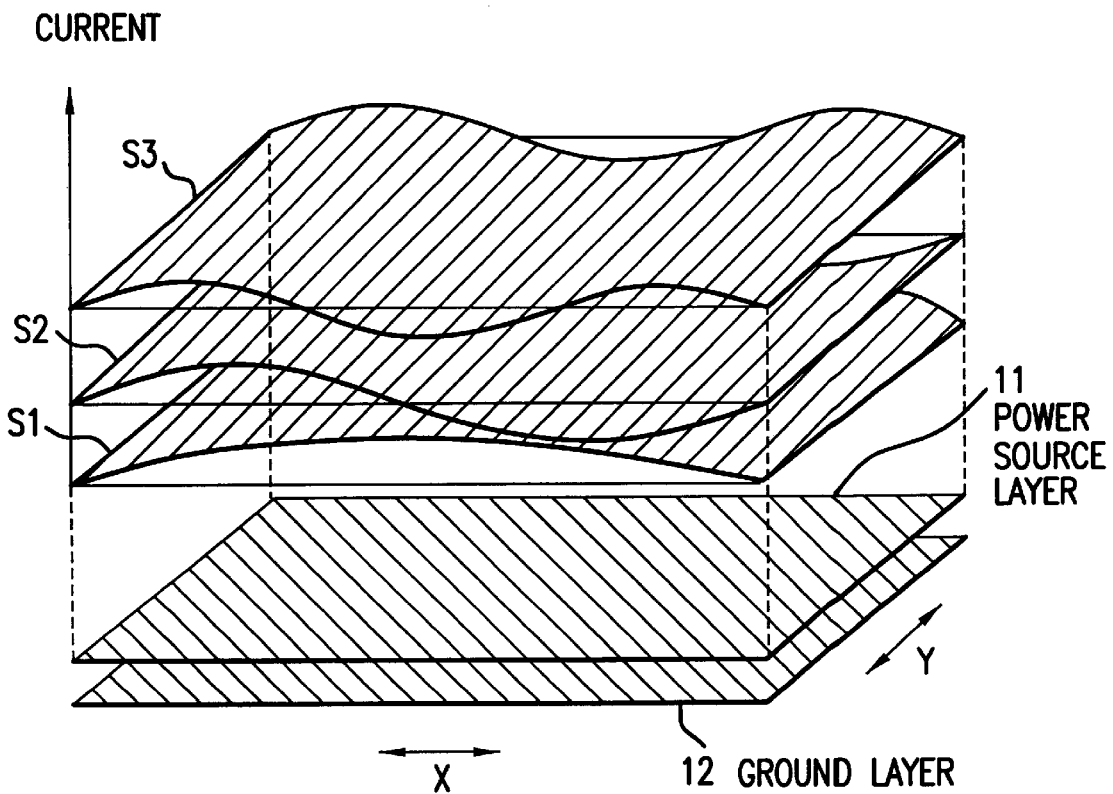
FIG. 5 is a diagrammatic view of assistance in explaining a standing wave generated on a printed wiring board.

Referring to FIG. 5, the standing wave is a composite wave composed of a fundamental wave S1 of a frequency $f=c/(2W\epsilon^{1/2})$, where c is light velocity, $\epsilon$ is the dielectric constant of the material of the printed wiring board 10 and W is the width of a portion of the printed wiring board 10 along the X- axis parallel to the flowing direction of an electrical resonance current or the Y- axis in which the power source layer 11 and the ground layer 12 correspond to each other equal to ½ of wavelength λ, and the harmonics including a second harmonic S2, a third harmonic S3 and so on. A standing wave along the X- or the Y- axis or standing waves along the X- and the Y- axis are generated.

Figure 7A:
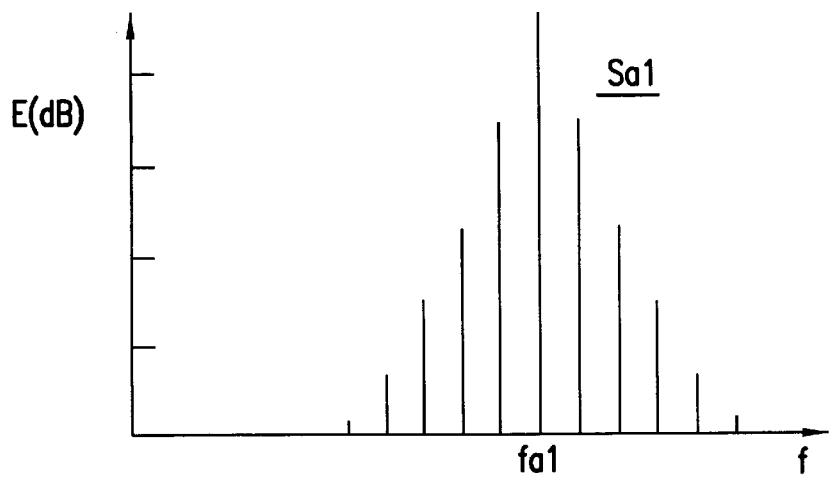
FIGS. 7(A), 7(B) and 7(C) are graphs of assistance in explaining the effect of the present invention on the reduction of electromagnetic radiation.

As shown in FIG. 7 (A), a spectrum Sa1 of electromagnetic radiation caused by the standing wave has a frequency distribution about a resonance frequency fa1. The spectrum Sa1 represents electromagnetic radiation caused by resonance of the lowest order. Generally, spectrum includes electromagnetic radiation caused by resonance of higher orders.

In this embodiment, it is assumed that the electrical resonance current unique to the printed wiring board 10 flows mainly in a direction parallel to the X- axis, and first capacitors 1 for the high-frequency coupling of the power source layer 11 and the ground layer 12 are arranged in borders along the opposite sides of a functional portion in which the power source layer 11 and the ground layer 12 correspond to each other of the printed wiring board 10 at the opposite ends with respect to the X- axis as shown in FIGS. 1 and 2.

The opposite sides of the functional portion of the printed wiring board 10 at the opposite ends with respect to the X- axis correspond to the nodes of the fundamental wave S1 and some of the nodes of the harmonics including the second harmonic and the third harmonic.

As shown in FIG. 3, each first capacitor 1 has one electrode connected through a via hole 16 to the power source layer 11, and the other electrode connected through a via hole 15 to the ground layer 12.

The first capacitors 1 thus arranged suppresses the reflection of the displacement current $i_a$ at the opposite ends of the portion of the printed wiring board 10 in which the power source layer 11 and the ground layer 12 correspond to each other, so that electromagnetic radiation caused by electrical resonance between the power source layer 11 and the ground layer 12 can be reduced.

Results of analytical study of resonance currents made by the inventors of the present invention showed that the resonance currents flow uniformly on the surface of the printed wiring board 10 along the axis of the printed wiring board 10, each resonance current is equivalent to a current which flows through two parallel lines having a characteristic impedance $Z_0$ and is reflected repeatedly at the opposite ends of the two parallel lines to exhibit resonance.

In this case, the reflectance p of the end of the printed wiring board 10 is expressed by:

$$\rho=(r-Z)/(r+Z) \qquad (1)$$

where r is the terminal impedance of the printed wiring board 10, and Z is transmission impedance on the power source layer 11 and the ground layer 12. In an ordinary printed wiring board, the reflectance $\rho_0$ is approximately equal to 1, because the ends are open ends where terminal impedance $r_0$ is substantially infinity.

Figure 8A:
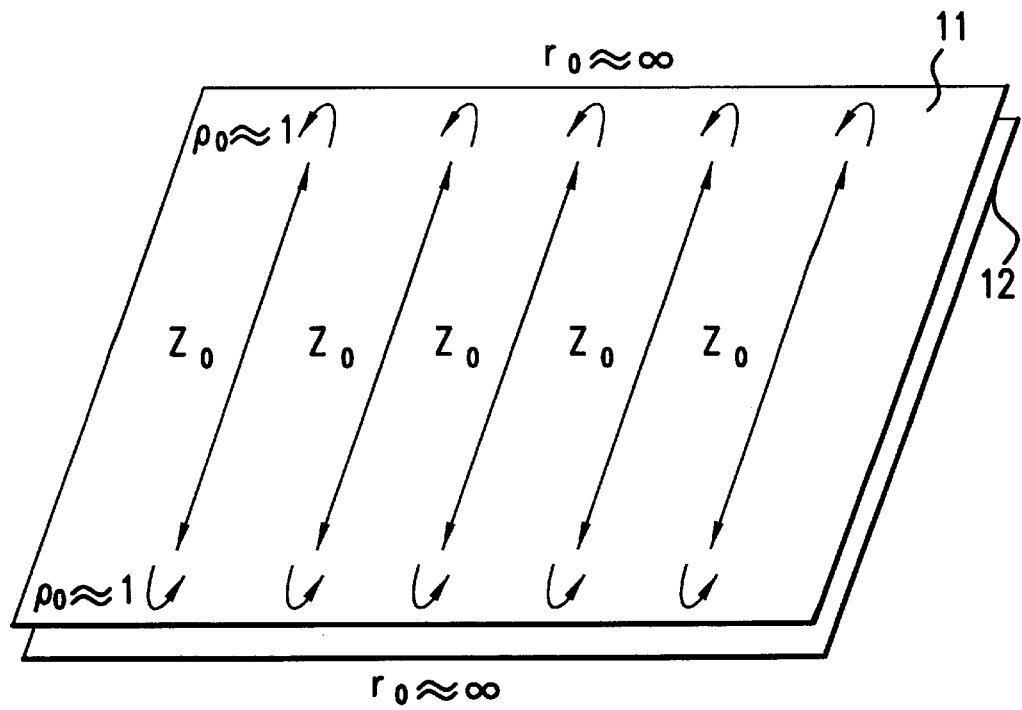
FIGS. 8(A) and 8(B) are views of assistance in explaining current reflection at the edges of a printed wiring board.
Figure 8B:
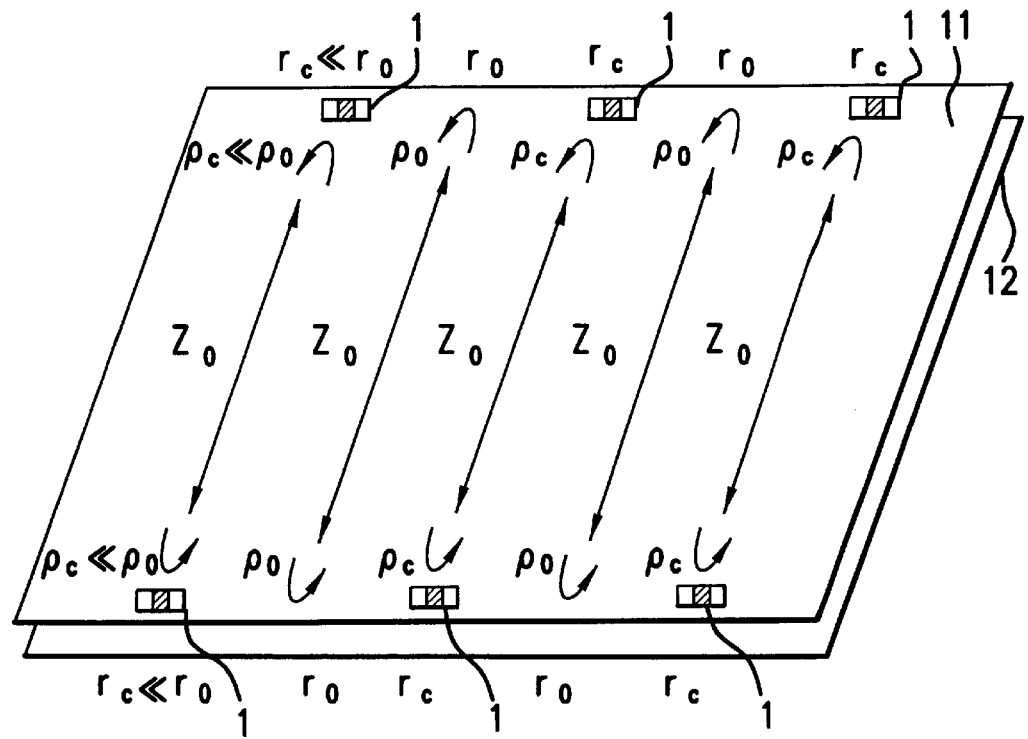
Figure 9:
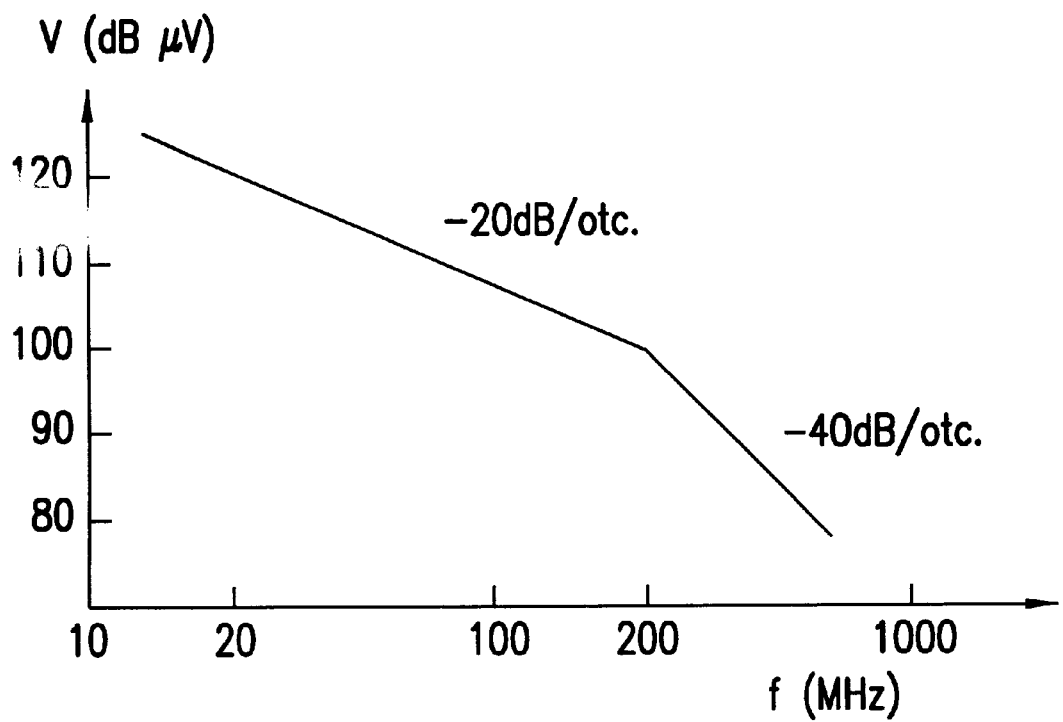
FIG. 9 is a graph of assistance in explaining the effect of the present invention.

When the first capacitors 1 are arranged in the above-mentioned arrangement, the reflectance $\rho_c$ decreases and the resonance current on the printed wiring board 10 is reduced, because the first capacitors 1 reduce the terminal impedance $r_c$ to high-frequency waves as shown in FIG. 8 (B).

The first capacitors 1 exercise an effect similar to a wavelength reducing effect of an antenna. As represented by a spectrum Sa2 in FIG. 7(B), the first capacitors 1 shift the resonance frequency from a frequency fa1 to a higher frequency fa2. Thus, the following two effects provided by the first capacitors 1 further lowers the level of electromagnetic radiation caused by resonance.

The first effect is the distribution of resonance conditions on the surface of the printed wiring board 10 and resultant reduction of a value equivalent to Q by the upward shift of the resonance frequency.

The second effect is the reduction of the harmonic components of switching voltage by the upward shift of the resonance frequency. If the digital IC chips 3 and 4 are driven by power of, for example, 10 MHz, the harmonic components of the spectrum of switching voltage for switching the digital IC chips 3 and 4 decreases from about 20 dB/oct. in a frequency range below about 200 MHz to about 40 dB/oct. in a frequency range above about 200 MHz.

Figure 7B:
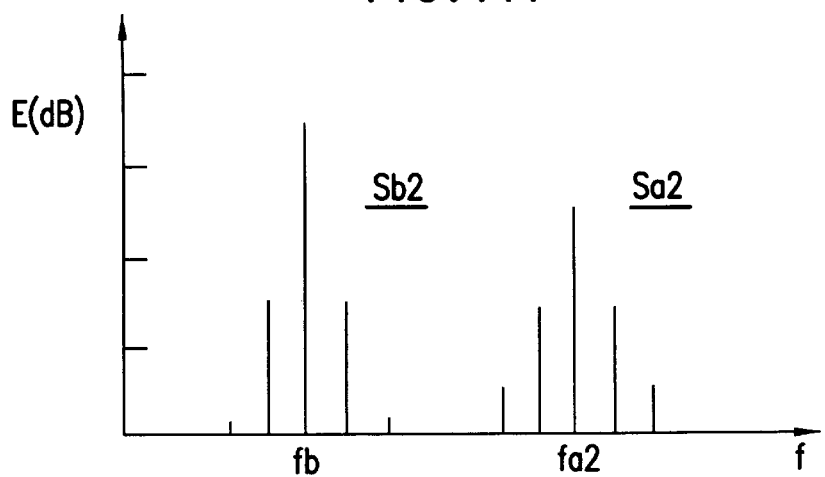
Figure 7C:
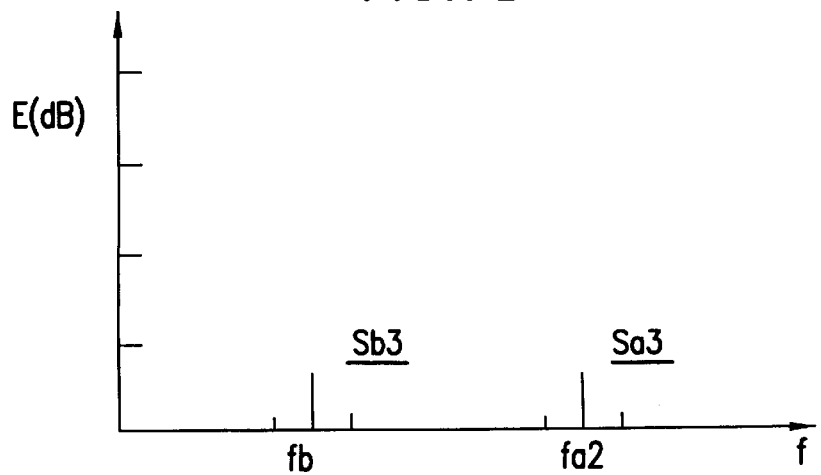

Although the first capacitors 1 for the high-frequency coupling of the power source layer 11 and the ground layer 12 are arranged in the foregoing arrangement, the effect of the first capacitors 1 on the reduction of electromagnetic radiation caused by electrical resonance between the power source layer 11 and the ground layer 12 is not satisfactory, which is obvious from a spectrum Sa2 shown in FIG. 7(B), and the arrangement of the first capacitors 1 for the high-frequency coupling of the power source layer 11 and the ground layer 12 causes secondary electromagnetic radiation not dependent on the electrical resonance between the power source layer 11 and the ground layer 12, which is obvious from a spectrum Sb2 shown in FIG. 7(B).

The effect of the first capacitors 1 on the reduction of primary electromagnetic radiation caused by electrical resonance between the power source layer 11 and the ground layer 12 is insufficient, because charges stored in the first capacitors 1 work as low-impedance power supplies to the power pins 3V and 4V of the digital IC chips 3 and 4, supply charges to the digital IC chips 3 and 4 when digital IC chips 3 and 4 perform switching operations, a transient currents flows from the first capacitors 1 to the digital IC chips 3 and 4, and the transient currents are coupled with the resonance between the power source layer 11 and the ground layer 12 and a resonance current flows on the surface of the printed wiring board 10.

Figure 10A:
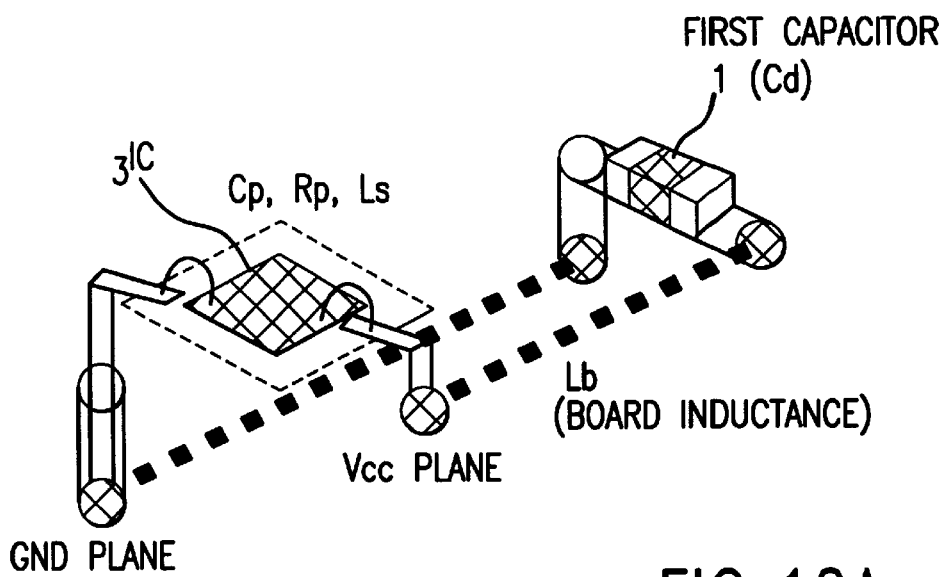
FIGS. 10(A), 10(B) and 10(C) are views of assistance in explaining the effect of the present invention.
Figure 10B:
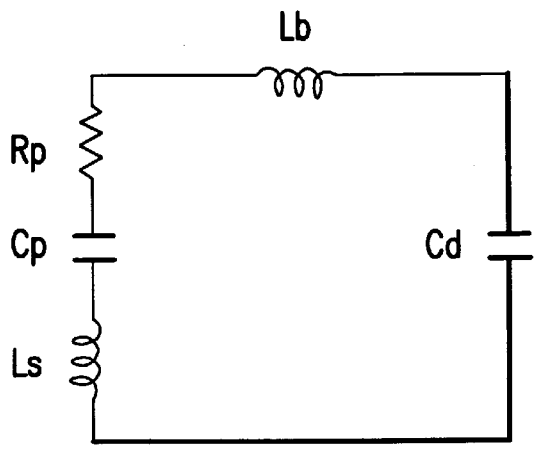

Secondary electromagnetic radiation is caused by the loop resonance between the first capacitors 1 and a power supply system for the digital IC chips 3 and 4. As regards the digital IC chip 3, for instance, the digital IC chip 3 or a power supply system for the same has a capacitance Cp, a lead inductance Ls and a resistance Rp as shown in FIG. 10(A). The digital IC chip 3, the capacitance Cd of the first capacitor 1, and a board inductance Lb between the first capacitor 1 and the digital IC chip 3 form a loop resonance circuit as shown in FIG. 10(B).

If the digital IC chip 3 is a standard TTL-IC chip, the capacitance Cp of the power supply system is on the order of 200 pF, and, desirably, the capacitance Cd of the first capacitor 1 is $1 \times 10^{-9}$ F or above. Therefore, the capacitance Cp of the power supply system is far smaller than the capacitance Cd of the first capacitor 1. The board inductance Lb, i.e., surface inductance, is far smaller than the lead inductance Ls.

Figure 10C:
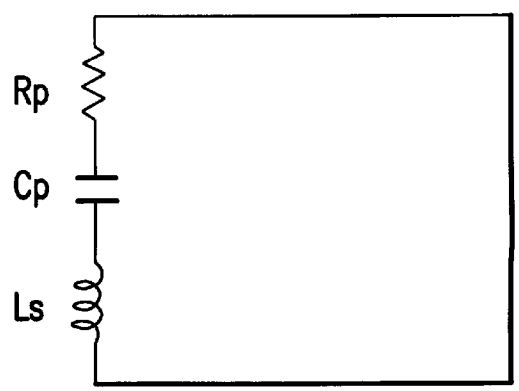

Accordingly, the loop resonance circuit is equivalent to a circuit shown in FIG. 10 (C). Practically, the resonant frequency fb of loop resonance is not dependent on the capacitance Cd of the first capacitor 1, and the distance between the first capacitor 1 and the digital IC chip 3, but dependent on the capacitance Cp of the power supply system and the lead inductance Ls of the digital IC chip 3. If Cp=200 pF and Ls=20 nH, the resonant frequency fb≈80 MHz.

The level of secondary electromagnetic radiation caused by loop resonance is high when loop area is large. In this embodiment, second capacitors 2, which serve as power supply for supplying a transient current to the digital IC chips 3 and 4 are provided between the power pins 3V and 4V of the digital IC chips 3 and 4, and the ground layer 12, respectively, as shown in FIGS. 1, 2 and 4.

Each of the second capacitors 2 has a first electrode 2a connected through a via hole 17 to the power source layer 11 and to the power pin 3V (4V) of the digital IC chip 3 (4), and a second electrode 2b connected through a via hole 18 to the ground layer 12. The power pins 3V and 4V of the digital IC chips 3 and 4, and the first electrodes 2a of the second capacitors 2 may be connected through via holes to the power source layer 11 instead of connecting the power pins 3V and 4V of the digital IC chips 3 and 4 to the first electrodes 2a of the second capacitors 2.

Most part of a transient current which flows into the digital IC chips 3 and 4 when the digital IC chips 3 and 4 operate for a switching action is supplied from the second capacitors 2 disposed near the power supply pins 3V and 4V of the digital IC chips 3 and 4, and transient current flows scarcely from the first capacitors 1 into the digital IC chips 3 and 4.

Therefore, most part of loop current flows through the power supply systems for the digital IC chips 3 and 4, and the second capacitors 2 disposed near the digital IC chips 3 and 4, and little part of transient current provided by the first capacitors 1 flows through the loop including the power source layer 11 and the ground layer 12. Therefore, as is obvious from a spectrum Sb3 shown in FIG. 7(C), secondary electromagnetic radiation caused by loop resonance can be effectively suppressed.

Since transient current flows scarcely from the first capacitors 1 into the digital IC chips 3 and 4, and resonance current is produced scarcely by the coupling of the harmonic components of transient current which flows from the first capacitors 1 into the digital IC chips 3 and 4 with the resonance between the power source layer 11 and the ground layer 12, resonance between the power source layer 11 and the ground layer 12 is suppressed satisfactorily, which is obvious from a spectrum Sa3 shown in FIG. 7 (C) and primary electromagnetic radiation caused by resonance between the power source layer 11 and the ground layer 12 can be effectively reduced.

Figure 11A:
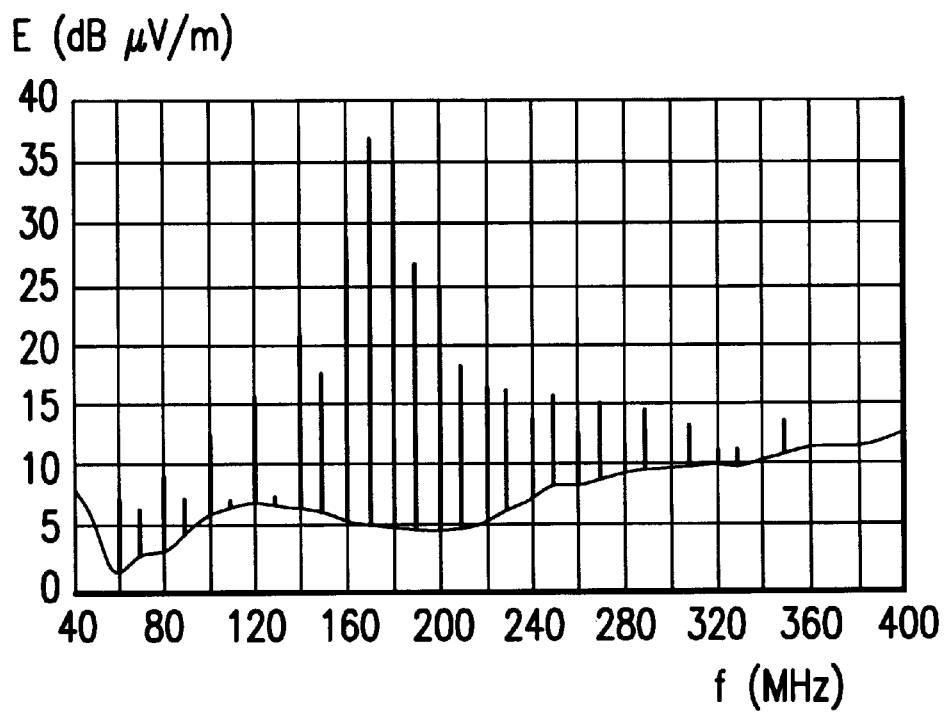
FIGS. 11(A) and 11(B) are graphs of assistance in explaining the effect of the present invention.
Figure 11B:
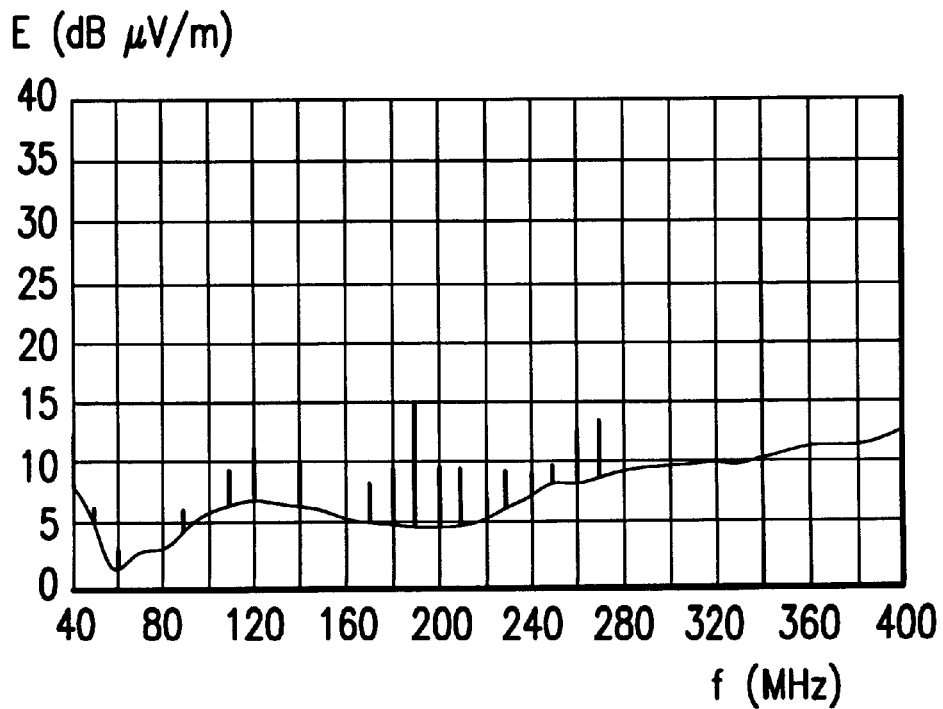

FIGS. 11(A) and 11(B) are graphs respectively showing measured intensities of radiation fields created by a first sample printed wiring board device when one gate of a TTLIC (74ALS04) mounted on a printed wiring board not provided with the first capacitors 1 and the second capacitors 2 was driven by a clock of 10 MHz, and by a second sample printed wiring board device when one gate of a TTLIC (74ALS04) mounted on a printed wiring board provided with the first capacitors 1 and the second capacitors 2 were driven by a clock of 10 MHz. Each of the printed wiring boards of the first and the second printed wiring board device was a 42 cm square glass-epoxy four-layer printed wiring board provided with a power source layer 11 and a ground layer 12 spaced 8 mm apart from each other, and having a 40 cm square portion in which the power source layer 11 and the ground layer 12 are formed opposite to each other. The intensities of radiation fields were measured by a 3 m method.

As shown in FIG. 11(A), the distribution of the intensity of the radiation field for the first sample printed wiring board device employing the printed wiring board not provided with the first capacitors 1 and the second capacitors 2 has a maximum radiation electric field intensity E of 37 dBµV/m at the frequency of about 170 MHz of the primary natural vibration of the first printed wiring board. The printed wiring board of the second sample printed wiring board device was provided with nine first capacitors 1 of $1 \times 10^{-7}$ F arranged at intervals of 5 cm along in a border along each of opposite sides of a 40 cm square functional portion thereof, and second capacitors 2 of $1 \times 10^{-8}$ F disposed near the power supply pins of the IC chips. It is known from the comparative observation of FIGS. 11(A) and 11(B) that the first capacitors 1 and the second capacitors 2 reduce electromagnetic radiation by 20 dBµV/m or above.

The first capacitors 1 are for the high-frequency coupling of the power source layer 11 and the ground layer 12, and the second capacitors 2 are sources of transient current. Therefore, the first capacitors 1 and the second capacitors 2 must be those having capacitances greater than a certain limit.

Figure 12:
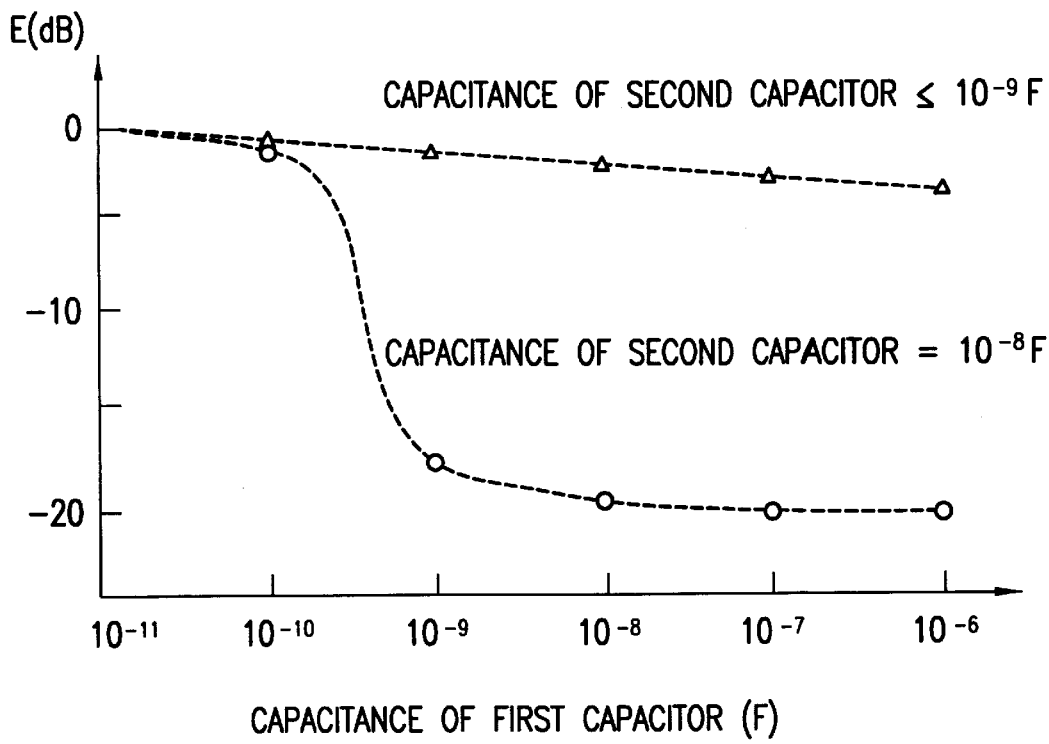
FIG. 12 is a graph showing the relation between the capacitance of a capacitor and electromagnetic radiation reducing effect.

FIG. 12 is a graph showing the variation of measured electromagnetic radiation reducing effect with the capacitance of the first capacitors 1 for the capacitance of the second capacitors 2 as a parameter. The printed wiring board of a sample printed wiring board device, which was the same in size and structure as those of the sample printed wiring board devices subjected to measurement to obtain the data shown in FIGS. 11(A) and 11(B), was provided with nine first capacitors 1 arranged at intervals of 5 cm in a border along each of the opposite sides of the 40 cm square functional portion thereof. In FIG. 12, a plot indicated by circles is for the second capacitors 2 of $1 \times 10^{-8}$ F and a plot indicated by triangles is for the second capacitors 2 of $1 \times 10^{-9}$ F or below.

Figure 13:
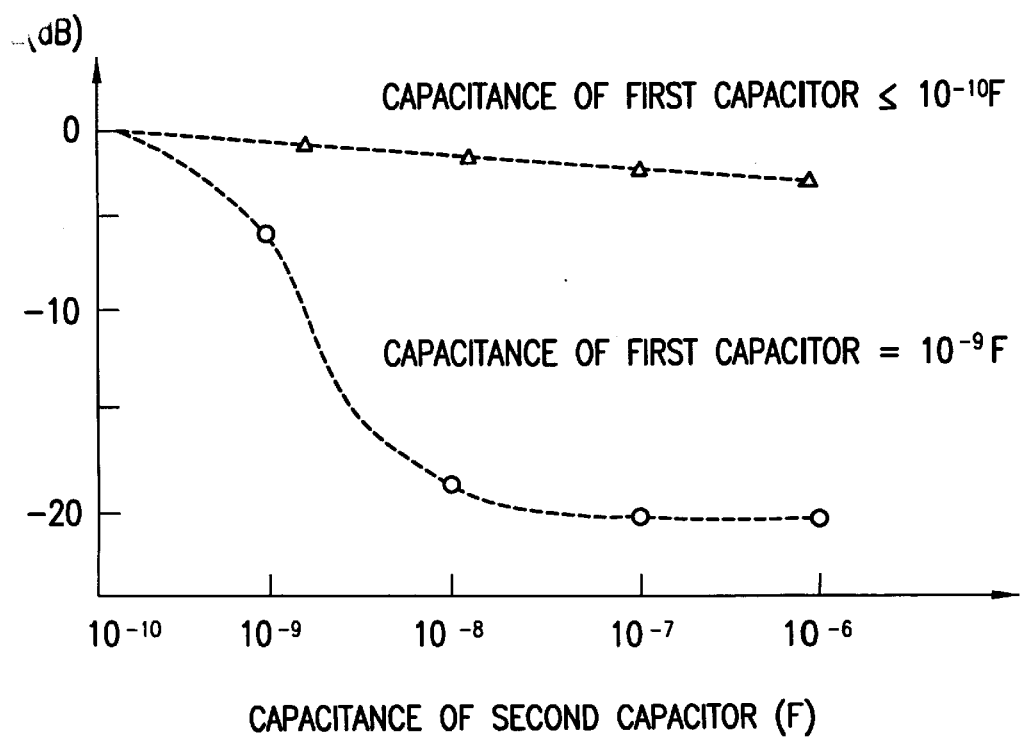
FIG. 13 is a graph showing the relation between the capacitance of a capacitor and electromagnetic radiation reducing effect.

FIG. 13 is a graph showing the variation of measured electromagnetic radiation reducing effect with the capacitance of the second capacitors 2 for the capacitance of the first capacitors 1 as a parameter. A plot indicated by circles is for a printed wiring board device employing a printed wiring board provided with nine first capacitors 1 of $1 \times 10^{-9}$ F in capacitance arranged at intervals of 5 cm along a border along each of opposite sides of a 40 cm square functional portion thereof, and a plot indicated by triangles is for a printed wiring board device employing a printed wiring board provided with nine first capacitors of $1 \times 10^{-10}$ F or below arranged at intervals of 5 cm in a border along each of opposite sides of a 40 cm square portion thereof.

As is obvious from FIGS. 12 and 13, the electromagnetic radiation reducing effect of the present invention when the capacitance of the first capacitors 1 is $1 \times 10^{-9}$ F or above and the capacitance of the second capacitors 2 is $1 \times 10^{-8}$ F or above is particularly remarkable, and is far higher than that when only the first capacitors 1 of the same capacitance are employed and than that when only the second capacitors 2 of the same capacitance are employed.

Primary electromagnetic radiation suppressing effect was −10 dB and substantial electromagnetic radiation reducing effect including the increase of secondary electromagnetic radiation was −2 dB when the same printed wiring board as that employed in the sample printed wiring board device subjected to measurement to obtain the data shown in FIGS. 11(A) and 11(B) was provided with only the first capacitors 1. The primary electromagnetic radiation suppressing effect and the substantial electromagnetic radiation suppressing effect were −2 dB when the same printed wiring board was provided with only the second capacitors 2. The primary electromagnetic radiation suppressing effect and the substantial electromagnetic radiation suppressing effect were −22 dB when the same printed wiring board was provided with both the first capacitors 1 and the second capacitors 2.

Figure 14:
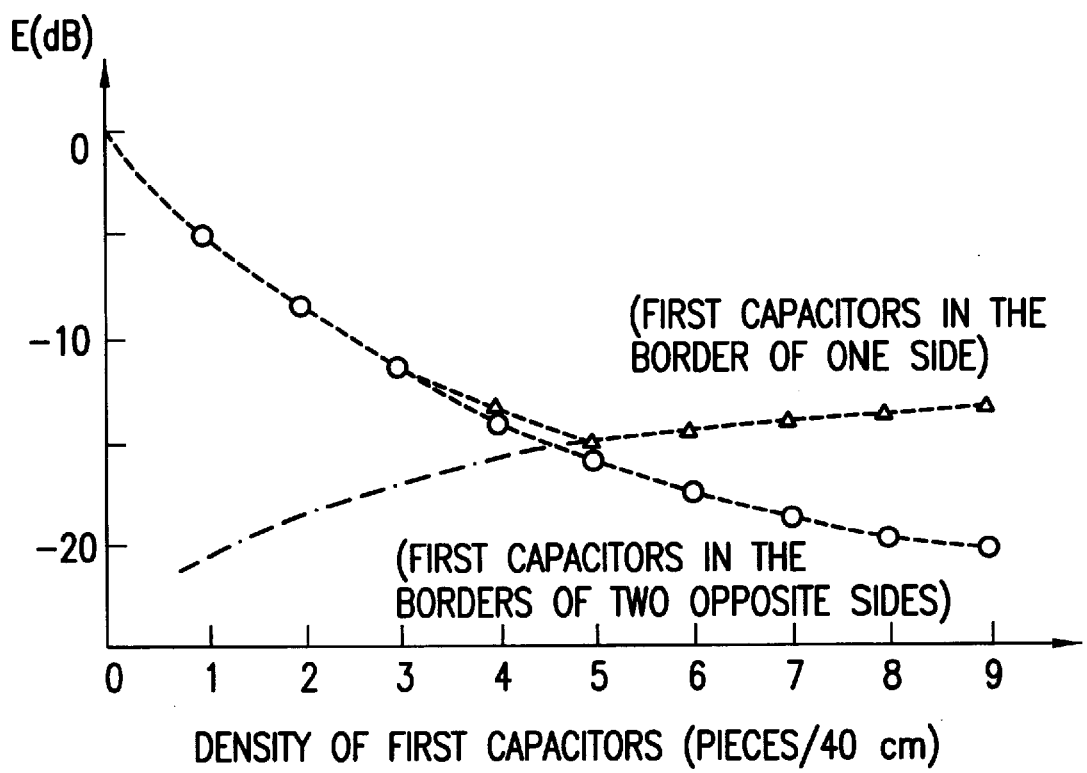
FIG. 14 is a graph showing the relation between the density of capacitors and electromagnetic radiation reducing effect.

FIG. 14 shows measured variation of electromagnetic radiation with the density of the first capacitor 1 on one side of the printed wiring board, in which a plot indicated by circles is for a printed wiring board on which first capacitors 1 are arranged on the opposite sides of the printed wiring board symmetrically with respect to a line perpendicular to the opposite sides of the printed wiring board, and a plot indicated by triangles is for a printed wiring board on which first capacitors 1 are arranged only on one side of the printed wiring board.

When the first capacitors 1 are arranged only on one side of the printed wiring board, secondary electromagnetic radiation becomes primary electromagnetic radiation as indicated by a broken curve and the level of electromagnetic radiation increases with the increase of the density of the first capacitors 1 when the density of the first capacitors 1 is greater than a certain value. When the first capacitors 1 are arranged on both the opposite sides of the printed wiring board, electromagnetic radiation decreases with the increase of the density of the first capacitors 1.

As is obvious from FIG. 14, the effect of the first capacitors 1 on the reduction of electromagnetic radiation is satisfactory if the density of the first capacitors 1 on each side of the printed wiring board is eight first capacitors per 40 cm, i.e., twenty capacitors per 1 m, or above.

Figure 15:
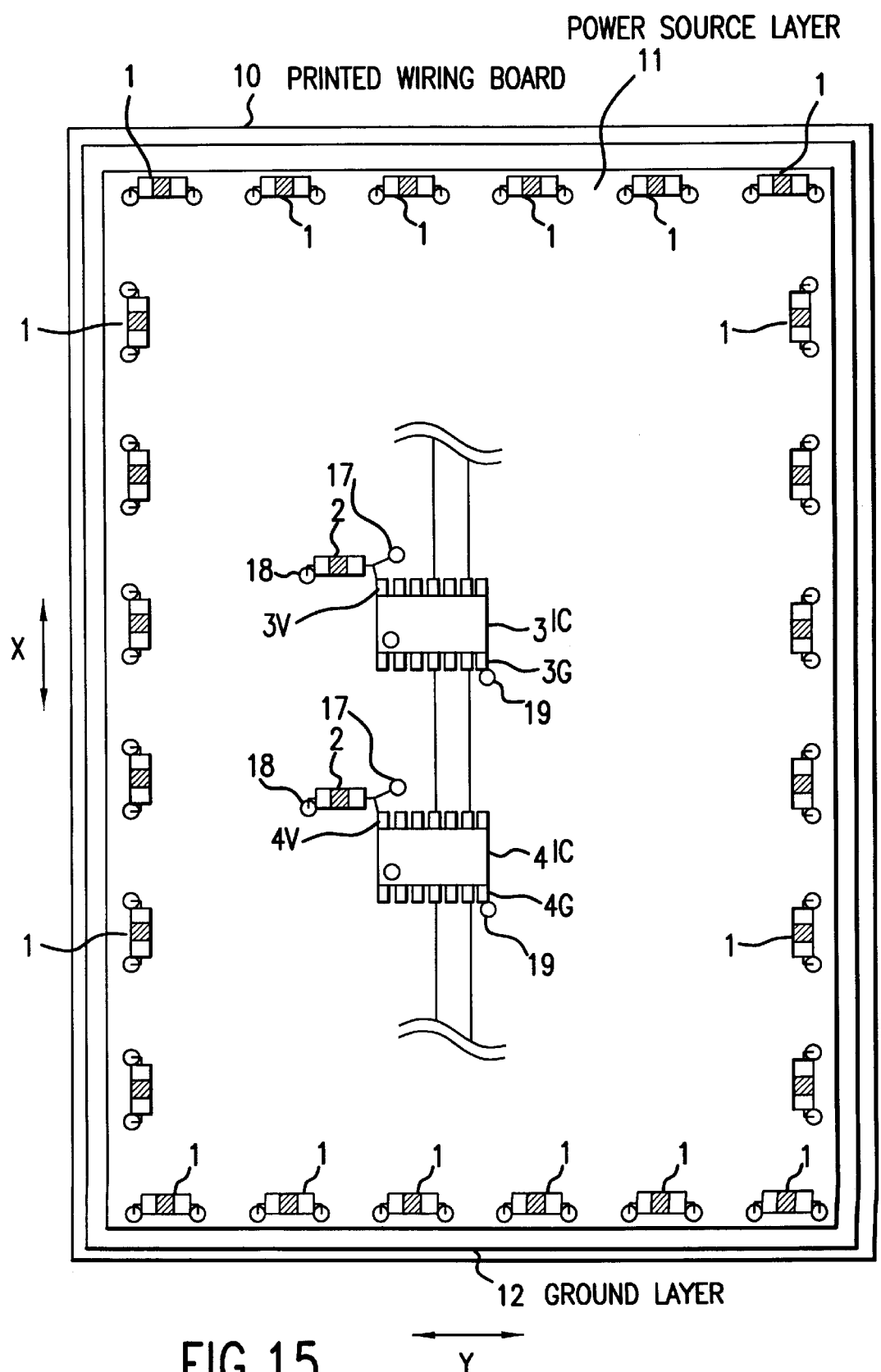
FIG. 15 is a schematic plan view of a printed wiring board device in a second embodiment according to the present invention.

The effect of first capacitors 1 on the reduction of electromagnetic radiation is further enhanced if the first capacitors 1 are arranged in borders along all the sides of a functional portion of a printed wiring board, i.e., along the four sides of a printed wiring board if the printed wiring board is rectangular, as shown in FIG. 15.

Figure 16A:
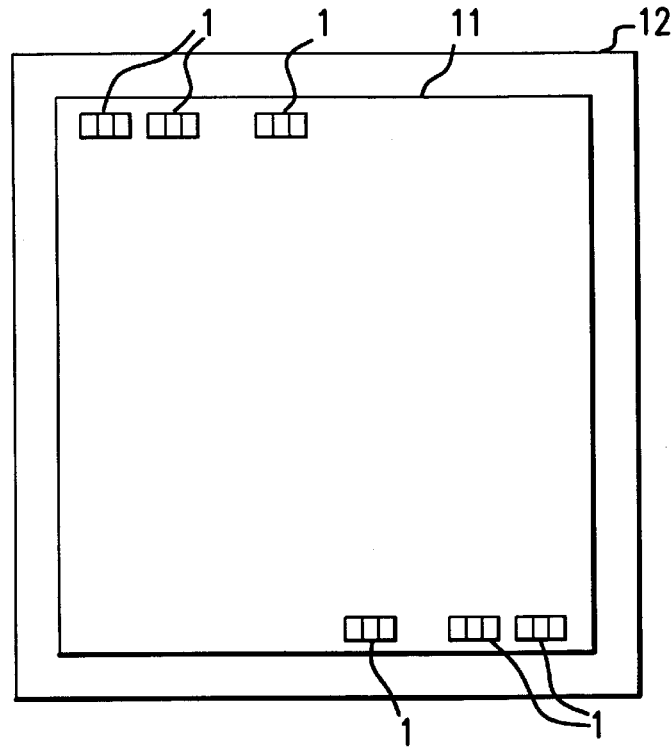
FIG. 16 is a schematic plan view of a printed wiring board device in a third embodiment according to the present invention.
Figure 16B:
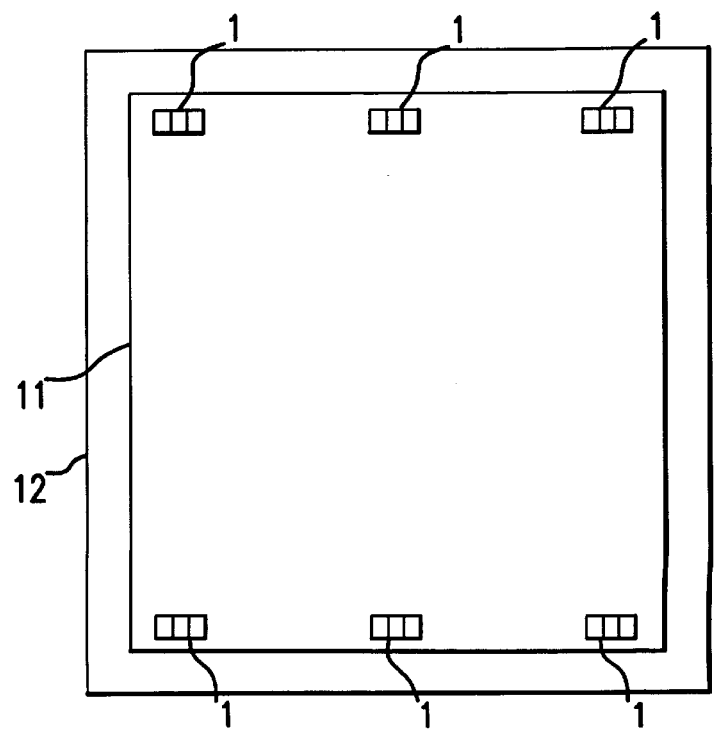

When first capacitors 1 are arranged in borders along the two opposite sides of a functional portion of a printed wiring board, it is more preferable to arrange the first capacitors 1 in the two opposite borders along the two opposite sides symmetrically with respect to a line parallel to the two opposite sides as shown in FIG. 16(B) than to arrange the same in the two opposite borders asymmetrically with respect to a line parallel to the two opposite sides as shown in FIG. 16(A). The electromagnetic radiation suppressing effect of the symmetrical arrangement of the first capacitors 1 is particularly significant for primary resonance or the like in which currents flow substantially along the axis of the printed wiring board.

In the strict sense, the currents do not flow along the axis of the printed wiring board, but the currents are distributed and deflected by parts mounted on the printed wiring board. Therefore, electromagnetic radiation suppressing effect can be satisfactorily achieved even if the first capacitors are arranged not exactly symmetrically.

Figure 17:
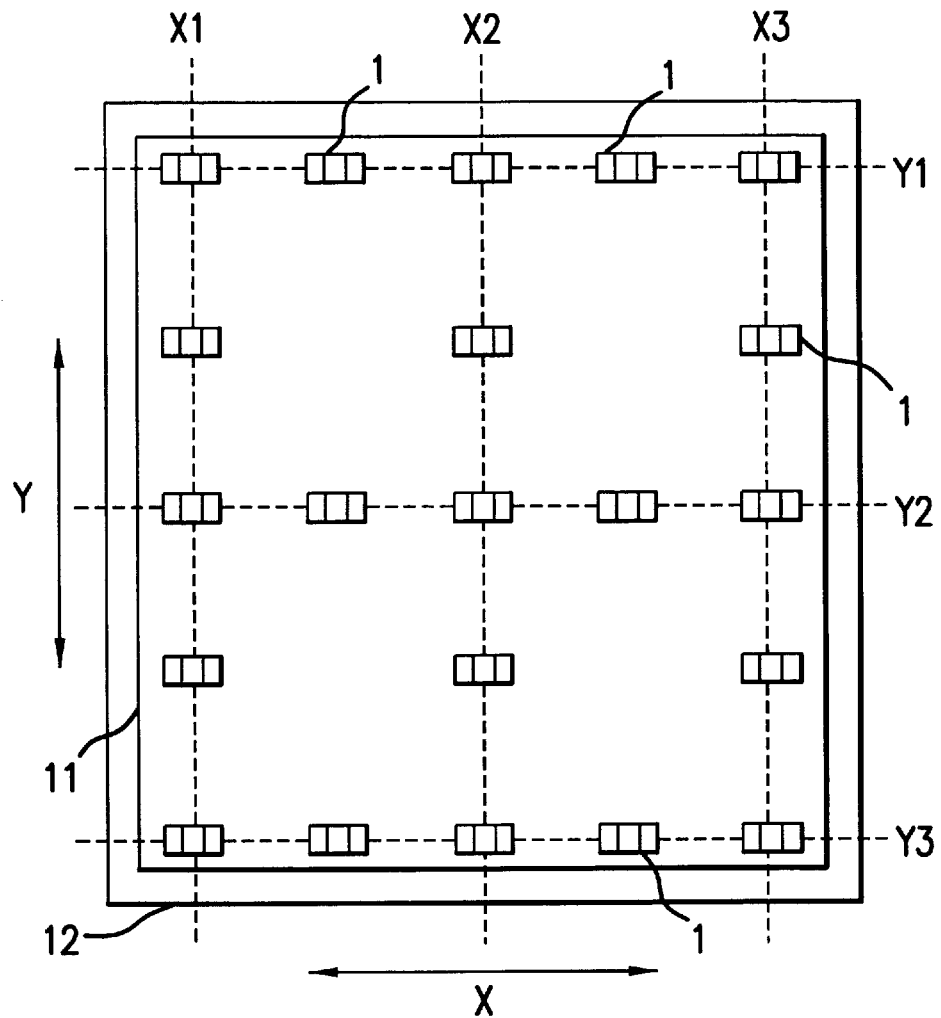
FIG. 17 is a schematic plan view of a printed wiring board device in a fourth embodiment according to the present invention.

Referring to FIG. 17 showing a printed wiring board device in a second embodiment according to the present invention, first capacitors 1 are arranged on a printed wiring board in a functional portion in which a power source layer 11 and a ground layer 12 correspond to each other of the printed wiring board on a line X1 along one side of the functional portion at one end with respect to X-directions, a line X3 along the other side of the functional portion at the other end with respect to X-directions, a line X2 extending in parallel to the lines X1 and X3 and in the middle between the lines X1 and X3, a line Y1 along one side of the functional portion at one end with respect to Y-directions, a line Y3 along the other side of the functional portion at the other end with respect to Y-directions, a line Y2 extending in parallel to the lines Y1 and Y3 and in the middle between the lines Y1 and Y3.

The first capacitors 1 on the lines X1 and X3 suppress resonance components of odd orders and even orders with respect to the X-directions, the first capacitors on the lines Y1 and Y3 suppress resonance components of odd orders and even orders with respect to the Y-directions, the first capacitors on the line X2 suppresses resonance components of even orders with respect to the X-directions, and the first capacitors 1 on the line Y2 suppresses resonance components of even orders with respect to the Y-directions.

The printed wiring board device is provided with active elements, such as IC chips, and second capacitors, which are not shown in FIG. 17. If the active element, such as an IC chip, is disposed near a node of an electrical resonance current, the power supply pin of the active element is positioned at the node of the electrical resonance current to enable a second capacitor associated with the power supply pin to serve as a first capacitor to be disposed at the node of the electrical resonance current.

Figure 18:
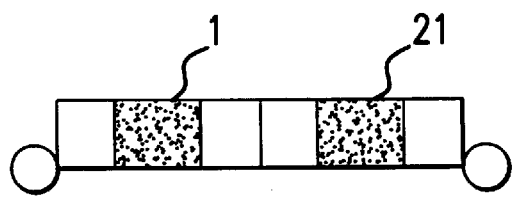
FIG. 18 is a typical view of a first capacitor and a resistor connected in series to the first capacitor.
Figure 19:
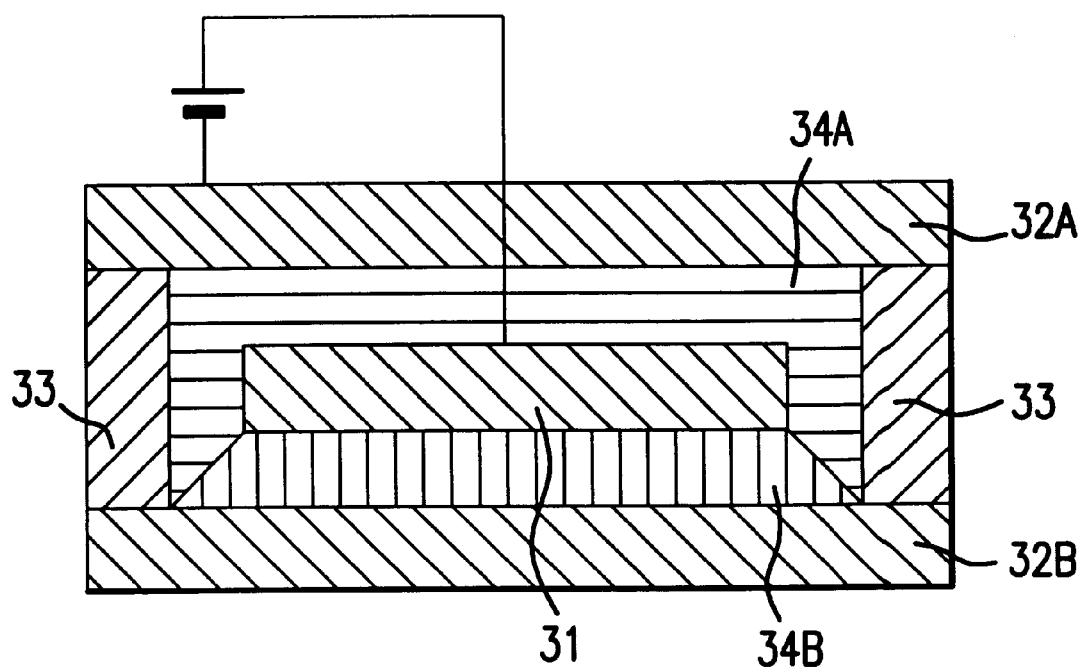
FIG. 19 is a typical sectional view of a conventional printed wiring board device.

A resistor 21 may be connected in series to each first capacitor 1 as shown in FIG. 18. The energy of a high-frequency current bypassed the first capacitor 1 is consumed by the resistor 21, so that the respective potentials of the power source layer 11 and the ground layer 12 are stabilized.

INDUSTRIAL APPLICABILITY

A printed wiring board device according to the present invention will be used for electronic equipment, such as information equipment, etc.

What is claimed is:

1. A printed wiring board device comprising:
   a printed wiring board provided with a power source layer and a ground layer;
   active elements connected to the power source layer and the ground layer;
   first capacitors which conductively couple the power source layer and the ground layer with each other at a high frequency, provided along the peripheral part of the section of the printed wiring board, where the power source layer and the ground layer are faced to each other; and second capacitors which respectively supply transient currents to the active elements, provided between a power supply pin of each active element or a portion of the power source layer in the vicinity of the power supply pin, and the ground layer.

2. A printed wiring board device according to claim 1, wherein the peripheral part of the section of the printed wiring board along in which the first capacitors are provided is at least a border along one side of the section of the printed wiring board at one end in the direction of an electrical resonance current inherent in the printed wiring board.

3. A printed wiring board device according to claim 1, wherein the peripheral part of the section of the printed wiring board along in which the first capacitors are provided is borders along two opposite sides of the section of the printed wiring board in the direction of an electrical resonance current inherent in the printed wiring board.

4. A printed wiring board device according to claim 3, wherein the first capacitors are provided in the borders along the two opposite sides of the section of the printed wiring board symmetrically to a line perpendicular to the direction of the electrical resonance current.

5. A printed wiring board device according to claim 1, wherein the first capacitors are provided in borders along all the sides of the section of the printed wiring board.

6. A printed wiring board device according to claim 1, wherein the first capacitors have a capacitance of $1 \times 10^{-9}$ F or above, and the second capacitors have a capacitance of $1 \times 10^{-8}$ F or above.

7. A printed wiring board device according to claim 1, wherein the first capacitors are arranged in a linear density of twenty capacitors per one meter or above.

8. A printed wiring board device according to claim 1, wherein a resistor is connected in series to each of the first capacitors.

9. Electronic equipment comprising a printed wiring board device according to claim 1.

10. A printed wiring board device comprising:

a printed wiring board provided with a power source layer and a ground layer;

active elements connected to the power source layer and the ground layer;

first capacitors which conductively couple the power source layer and the ground layer with each other at a high frequency, provided along the nodes of an electrical resonance current inherent in the printed wiring board in the section of the printed wiring board, where the power source layer and the ground layer are faced to each other; and second capacitors which respectively supply transient currents to the active elements, provided between a power supply pin of each active element or a portion of the power source layer in the vicinity of the power supply pin, and the ground layer.

11. A printed wiring board device according to claim 10, wherein the nodes of the electrical resonance current along which the first capacitors are provided are at least a border along one side of the section of the printed wiring board at one end in the direction of the electrical resonance current inherent in the printed wiring board.

12. A printed wiring board device according to claim 10, wherein the nodes of the electrical resonance current along which the first capacitors are provided are borders along two opposite sides of the section of the printed wiring board in the direction of the electrical resonance current inherent in the printed wiring board.

13. A printed wiring board device according to claim 10, wherein the nodes of the electrical resonance current along which the first capacitors are provided are borders along all the sides of the section of the printed wiring board.

* * * * *